(12) United States Patent
Kodera

(10) Patent No.: US 8,247,903 B2
(45) Date of Patent: Aug. 21, 2012

(54) SEMICONDUCTOR DEVICE

(75) Inventor: Keisuke Kodera, Hyogo (JP)

(73) Assignee: Panasonic Corporation, Osaka (JP)

( * ) Notice: Subject to any disclaimer, the term of this patent is extended or adjusted under 35 U.S.C. 154(b) by 103 days.

(21) Appl. No.: 12/957,878

(22) Filed: Dec. 1, 2010

(65) Prior Publication Data

US 2011/0133184 A1    Jun. 9, 2011

(30) Foreign Application Priority Data

Dec. 4, 2009   (JP) .................................. 2009-276364

(51) Int. Cl.
*H01L 23/48*   (2006.01)
*H01L 23/52*   (2006.01)
*H01L 29/40*   (2006.01)

(52) U.S. Cl. ................. 257/758; 257/211; 257/E23.145
(58) Field of Classification Search .................. 257/211, 257/758, 760, 775, E23.145
See application file for complete search history.

(56) References Cited

U.S. PATENT DOCUMENTS

| 7,667,330 B2 * | 2/2010 | Lee ................................ 257/773 |
| 2002/0003305 A1 | 1/2002 | Umakoshi et al. |
| 2004/0016949 A1 | 1/2004 | Semi |
| 2007/0052068 A1 | 3/2007 | Takemura et al. |
| 2007/0138638 A1 | 6/2007 | Ota et al. |
| 2008/0017990 A1 | 1/2008 | Koubuchi et al. |

FOREIGN PATENT DOCUMENTS

JP    2007-67332    3/2007

* cited by examiner

*Primary Examiner* — Hoai V Pham
(74) *Attorney, Agent, or Firm* — McDermott Will & Emery LLP

(57) ABSTRACT

A semiconductor device includes an insulating film formed on a substrate; an interconnect layer including a plurality of interconnects formed in the insulating film; and a pad formed on the insulating film. In a region containing at least a part of a section below the pad, a narrow spacing region is formed, where a spacing between the adjacent interconnects is shorter than that in a section outside the region containing at least a part of the section below the pad.

9 Claims, 6 Drawing Sheets

SEMICONDUCTOR DEVICE

CROSS-REFERENCE TO RELATED APPLICATION

This application claims priority to Japanese Patent Application No. 2009-276364 filed on Dec. 4, 2009, the disclosure of which including the specification, the drawings, and the claims is hereby incorporated by reference in its entirety.

BACKGROUND

In order to electrically connect a semiconductor device to external devices, a probe is pressed against a pad provided in the semiconductor device upon an electrical test; or wire bonding is performed, or bumps are formed on the pad during assembly. For example, when pressing the probe against the pad upon the electrical test, stress is downwardly applied from an upper surface of the pad in the vertical direction. In such a state, it is required to break through an oxide film formed on a surface of the pad, and therefore stress is concentrated at a tip end of the probe. In addition, during the assembly by wire bonding etc., stress is similarly applied.

When such stress is excessively applied, cracks are caused in an insulating film supporting interconnects, resulting in current leakage. In addition, it also causes property variation of elements such as transistors.

Thus, an arrangement of the elements such as transistors and the interconnects below the pad has been avoided in order to reduce an influence of the stress caused upon the electrical test and during the assembly. However, a higher priority has been recently assigned to cost reduction by reducing a chip size, and the elements and the interconnects tend to be arranged below the pad.

For example, Japanese Patent Publication No. 2007-67332 (hereinafter referred to as "Patent Document 1") describes a way to solve the problem due to the stress caused in the foregoing case. In Patent Document 1, a structure is employed, in which a plurality of interconnect layers are arranged below a pad. Further, as illustrated in FIG. 7, interconnects 112 arranged right below a pad 101 covers equal to or greater than 30% of the pad. This can reduce stress to be applied to the interconnect layers.

SUMMARY

However, the structure of Patent Document 1 is insufficient for reducing cracks. In particular, stress applied to an insulating film formed between the pad and the interconnect positioned in the layer below the pad cannot be reduced even if the percentage of the interconnect area below the pad is increased as in Patent Document 1. Thus, such a problem should be solved.

In view of the foregoing, a method will be described, by which cracks to be caused in an insulating layer are reduced in a semiconductor device having a structure in which interconnects are arranged below a pad.

A semiconductor device of present disclosure includes an insulating film formed on a substrate; an interconnect layer including a plurality of interconnects formed in the insulating film; and a pad formed on the insulating film. In a region containing at least a part of a section below the pad, a narrow spacing region is formed, where a spacing between the adjacent interconnects is shorter than that in a section outside the region containing at least a part of the section below the pad.

According to such a semiconductor device, the narrow spacing region is used as a region to which stress is applied (e.g., a region against which a probe is pressed upon an electrical test, and a region in which the wire bonding is performed during assembly), thereby reducing cracks to be caused in the insulating film. This is because the spacing between the interconnects is shorter inside the narrow spacing region to allow a strong structure and to easily disperse the stress.

The width of each of the plurality of interconnects inside the narrow spacing region is preferably shorter than that outside the narrow spacing region.

This allows the stronger structure and the easy stress dispersion, thereby ensuring the reduction in occurrence of cracks.

The plurality of interconnects preferably include an interconnect which has a single section outside the narrow spacing region, and which is branched into more than two sections inside the narrow spacing region.

Such a method may be employed in order to shorten the spacing between the interconnects or the width of the interconnect inside the narrow spacing region.

The plurality of interconnects preferably include a non-electrically-connected dummy interconnect arranged inside the narrow spacing region.

That is, the followings are preferably provided as the plurality of interconnects inside the narrow spacing region: interconnects used for an electric connection in the semiconductor device; and dummy interconnects, each of which is arranged between the foregoing interconnects, and which are not used for the electric connection. Such a method may be employed in order to shorten the spacing between the interconnects inside the narrow spacing region.

It is preferable that at least a single test region is further provided on the pad and above the narrow spacing region.

This allows the narrow spacing region where cracks are less likely to be caused due to stress, to be used as the test region used for the electrical test. Thus, the occurrence of cracks due to, e.g., the stress applied by the probe upon the electrical test can be reduced.

At least a single bump is preferably formed on the pad and above the narrow spacing region.

At least a single wire is preferably connected to a section on the pad and above the narrow spacing region.

This reduces the occurrence of cracks due to stress during the assembly using bumps or wires.

At least a spacing between two interconnects may be shortened so as to define a tapered shape from an outside of the narrow spacing region toward an inside of the narrow spacing region.

Such a configuration may be employed in order to shorten the spacing between the interconnects.

The plurality of interconnects may be formed in the same layer.

According to the semiconductor device described above, the followings can be reduced: the occurrence of cracks caused in the insulating film between the pad and the interconnect layer below the pad due to the stress upon the electrical test or during the assembly; current leakage; and element property variation. Thus, deficiency due to arrangement of elements and the interconnects below the pad can be reduced. Consequently, a chip size can be reduced, resulting in cost reduction of the semiconductor device.

DETAILED DESCRIPTION

Figure 1A:
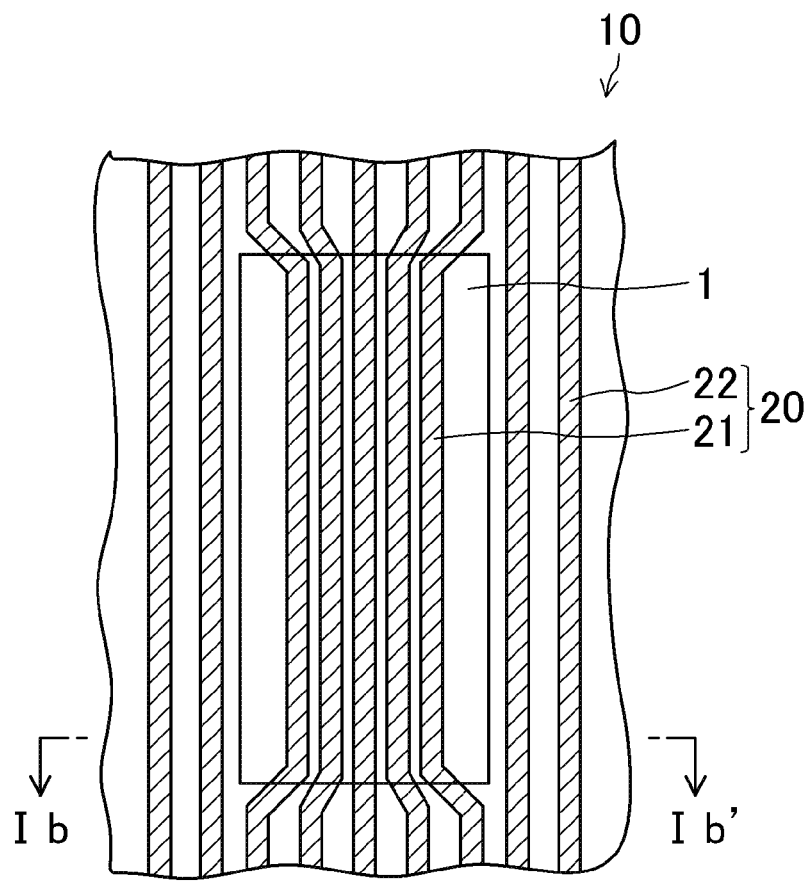
FIGS. 1(a) and 1(b) are top and cross-sectional views schematically illustrating a semiconductor device of a first example of an embodiment of the present disclosure.

A semiconductor device of an embodiment of the present disclosure will be described below with reference to the drawings. FIG. 1(a) is a plan view schematically illustrating a main section of a semiconductor device 10 of a first example, and FIG. 1(b) is an Ib-Ib' cross-sectional view of the semiconductor device 10.

Figure 1B:
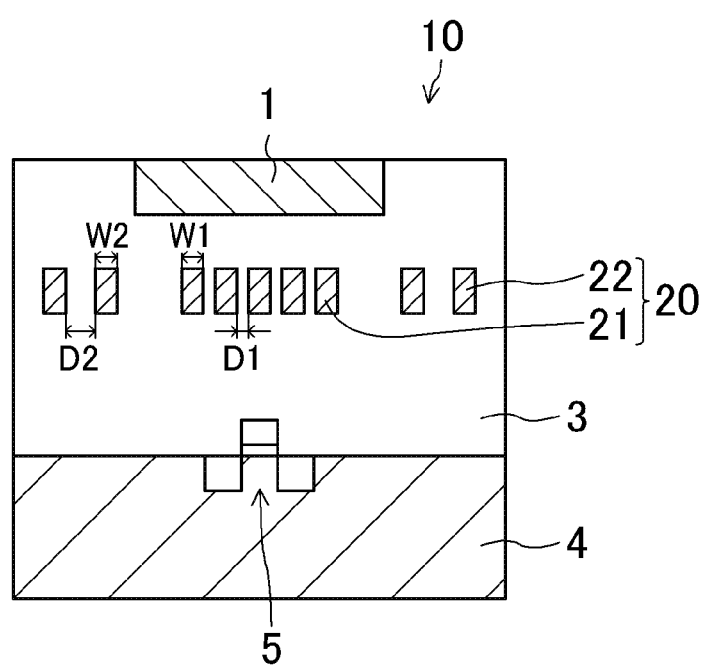

As illustrated in FIG. 1(b), the semiconductor device 10 includes a semiconductor substrate 4; an insulating film 3 formed on the semiconductor substrate 4; an interconnect layer formed in the insulating film 3, and including a plurality of interconnects 20; and a pad 1 formed so as to be embedded in an upper section of the insulating film 3. In addition, elements 5 such as transistors is formed in the semiconductor device 10. The semiconductor device 10 generally has a multilayer structure including a plurality of interconnect layers, an insulating film, a protective film, etc., but interconnects etc. in layers below the interconnects 20 are not shown in the figure. An example will be described below, in which interconnects 21 provided inside a predetermined region and interconnects 22 provided outside the predetermined region are formed in the same layer.

As illustrated in FIGS. 1(a) and 1(b), in the predetermined region below the pad 1, the interconnects 20 are arranged at a spacing shorter than a spacing between the interconnects outside the predetermined region. That is, among the interconnects 20, a spacing D1 between the interconnects 21 inside the predetermined region is shorter than a spacing D2 between the interconnects 22 outside the predetermined region. Note that a region where a spacing between adjacent interconnects is shorter than that between interconnects in other section is referred to as a "narrow spacing region" below.

The spacing D1 between the interconnects 21 is preferably as narrow as possible within a range in which insulation between the interconnects can be ensured, and is, e.g., 0.8 μm. On the other hand, the spacing D2 between the interconnects 22 is, but not limited to, e.g., approximately 2.5 μm.

Note that each of a width W1 of the interconnect 21 and a width W2 of the interconnect 22 is approximately 10 μm.

As described above, the structure is employed, which contains the narrow spacing region in which the interconnects 21 are arranged below the pad 1 so as to be adjacent to each other at the shorter spacing. Thus, occurrence of cracks due to contact of a probe to the pad upon an electrical test, and due to formation of external electrodes such as bumps and wires on the pad during assembly can be reduced in the insulating film 3 below the pad 1. This can reduce current leakage and element property variation due to cracks caused in the insulating film 3, and therefore the elements 5 can be arranged below the pad 1. Consequently, reduction in size of the semiconductor device 10 can be realized as compared to a semiconductor device having a structure in which elements are not arranged below a pad.

As illustrated in FIG. 1(a), at least a spacing between two interconnects 20 may be shortened so as to define a tapered shape from an outside of the narrow spacing region toward an inside of the narrow spacing region. Such a shape can reduce the occurrence of cracks inside the narrow spacing region, and can maintain the degree of freedom of wiring outside the narrow spacing region.

The pad 1 has, e.g., a stacking structure including a lower layer made of Cu and an upper layer made of Al. However, the pad 1 may have a single layer structure including a layer made of Al, Cu, or other material. The insulating film 3 may be made of, e.g., SiO$_2$ or other material. The interconnect 20 (interconnects 21 and 22) is made of, but not limited to, e.g., Cu.

Figure 2A:
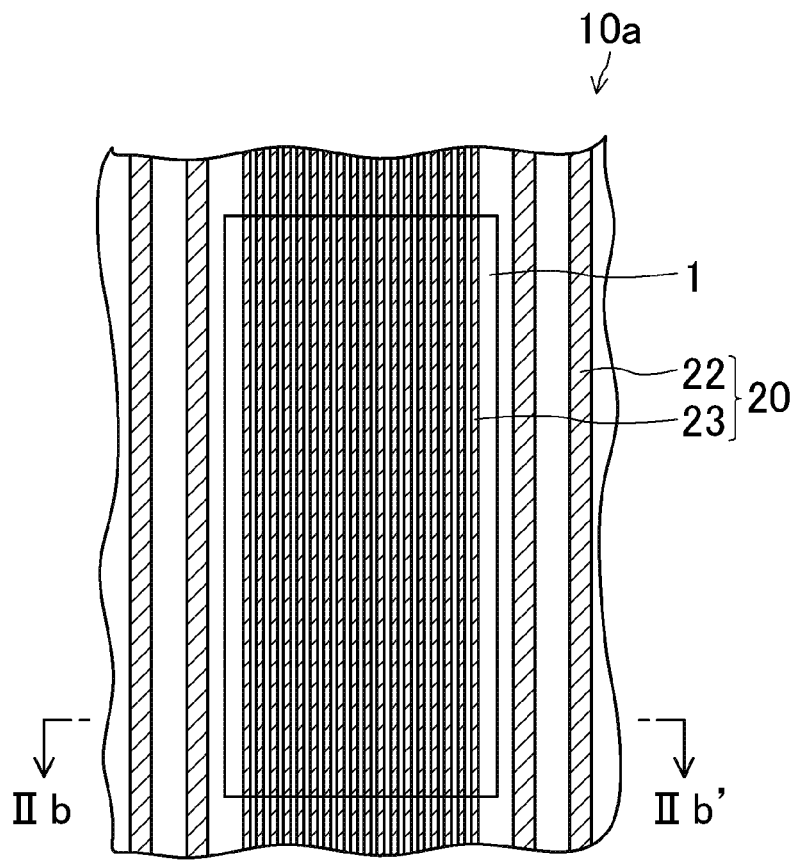
FIGS. 2(a) and 2(b) are top and cross-sectional views schematically illustrating a semiconductor device of a second example of the embodiment of the present disclosure.
Figure 2B:
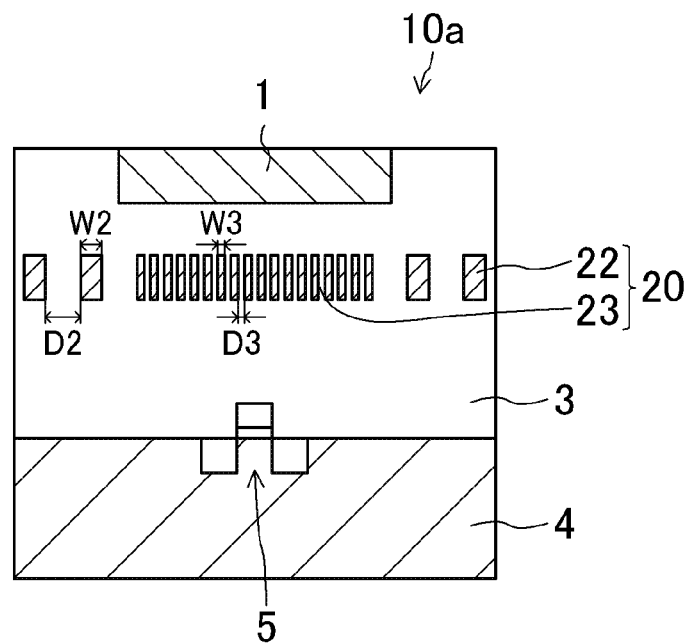

FIGS. 2(a) and 2(b) are views illustrating a semiconductor device 10a (second example) of the present embodiment. FIG. 2(a) is a plan view, and FIG. 2(b) is an IIb-IIb' cross-sectional view of the semiconductor device 10a. The semiconductor device 10a is similar to the semiconductor device 10 illustrated in FIGS. 1(a) and 1(b) in that the semiconductor device 10a includes a semiconductor substrate 4, an insulating film 3, interconnects 20, a pad 1, and elements 5; and that a narrow spacing region where a spacing between the interconnects 20 is shorter is formed. The semiconductor device 10a is particularly different from the semiconductor device 10 in a configuration of the interconnects 20, i.e., the interconnects extending through the narrow spacing region below the pad 1.

In the semiconductor device 10a, interconnects 22 are formed in a section other than the section below the pad 1. Interconnects 23 having a width W3 are formed so as to be arranged at a spacing D3 inside the narrow spacing region below the pad 1. As in the semiconductor device 10, the spacing D3 between the interconnects 23 inside the narrow spacing region is shorter than a spacing D2 between the interconnects 22 in other section, and is, e.g., 0.8 μm. In addition, in the semiconductor device 10a, the width W3 of the interconnect 23 is shorter than the width W2 of the interconnect 22, and is, e.g., 0.8 μm.

As described above, in the narrow spacing region, the width of the interconnect 20, and the spacing between the interconnects 20 are shorter than those in other section. Such a configuration is employed to more effectively reduce the followings as compared to the semiconductor device 10: occurrence of cracks in the insulating film 3 below the pad 1; current leakage; and element property variation. Consequently, reduction in size of the semiconductor device can be realized.

As illustrated in FIG. 2(a), in the semiconductor device 10a, a part of the narrow spacing region where the spacing between the interconnects 20 is shorter also extends to an outside of the section below the pad 1. Such a configuration does not cause any disadvantages, and is advantageous for ensuring an arrangement of the pad 1 on the narrow spacing region.

Figure 3:
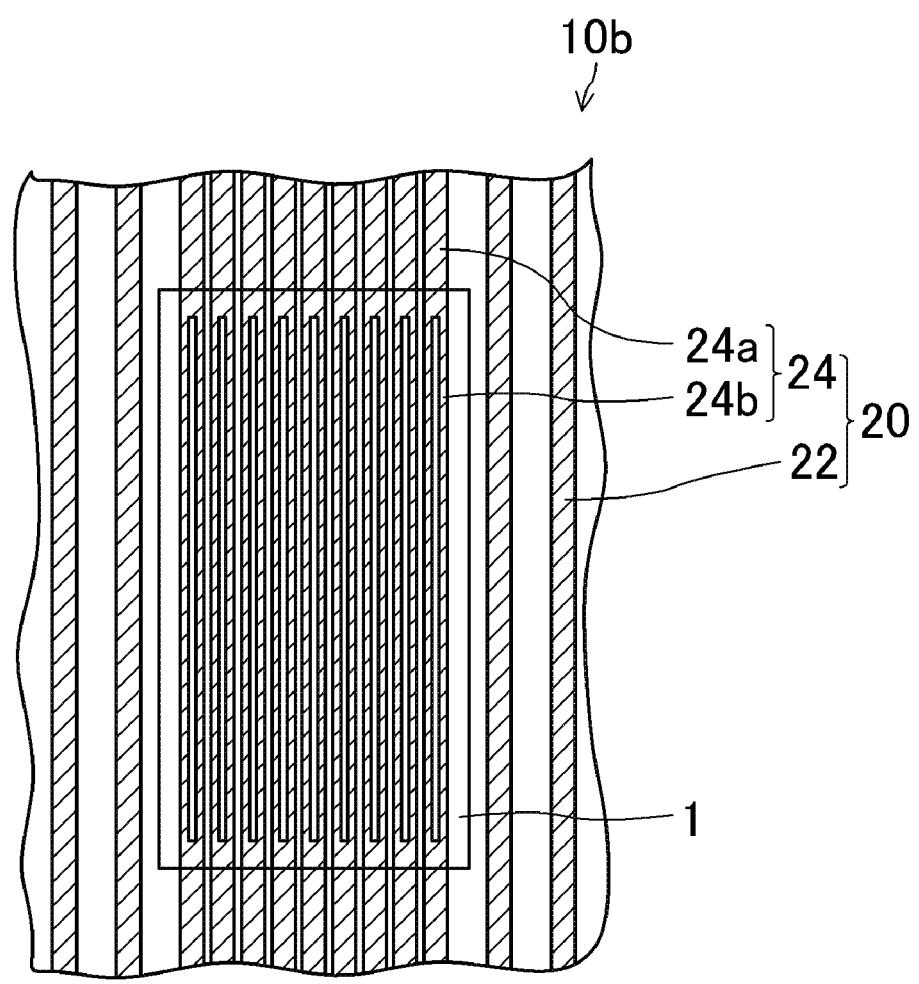
FIG. 3 is a top view schematically illustrating a semiconductor device of a third example of the embodiment of the present disclosure.

FIG. 3 is a plan view illustrating a semiconductor device 10b (third example) of the present embodiment. The semiconductor device 10b is similar to the semiconductor device 10 illustrated in FIGS. 1(a) and 1(b) in that the semiconductor device 10b includes a semiconductor substrate 4, an insulating film 3, interconnects 20, a pad 1, and elements 5; and that a narrow spacing region where a spacing between the interconnects 20 is shorter is formed. The semiconductor device 10b is particularly different from the semiconductor device 10 in a configuration of the interconnects 20, i.e., the interconnects extending through the narrow spacing region below the pad 1.

In the semiconductor device 10b, interconnects 22 are formed as the interconnects 20 in a section other than the section below the pad 1. Interconnects 24 extending through the narrow spacing region below the pad 1 are formed so as to be adjacent to each other at a spacing shorter than that between the interconnects 22 which do not extend through the narrow spacing region. The interconnects 24 include an interconnect section 24a having the same width as that of the interconnect 22; and branched interconnect sections 24b formed by branching the interconnect section 24a into a plurality of sections (two sections in this example) having a width shorter than that of the interconnect section 24a. In other words, the branched interconnect sections 24b are formed inside the narrow spacing region; and the width of the branched interconnect section 24b, and a spacing between the branched interconnect sections 24b are shorter than those of the interconnect 22 in other section. In addition, a plurality of branched interconnect sections 24b are combined into the interconnect section 24a outside the narrow spacing region.

According to the foregoing structure, the width of the interconnect 20, and the spacing between the interconnects 20 inside the narrow spacing region below the pad 1 are shorter than those in other section. This reduces occurrence of cracks in the insulating film 3 below the pad 1, current leakage, and element property variation. Consequently, reduction in size of the semiconductor device can be realized.

Figure 4:
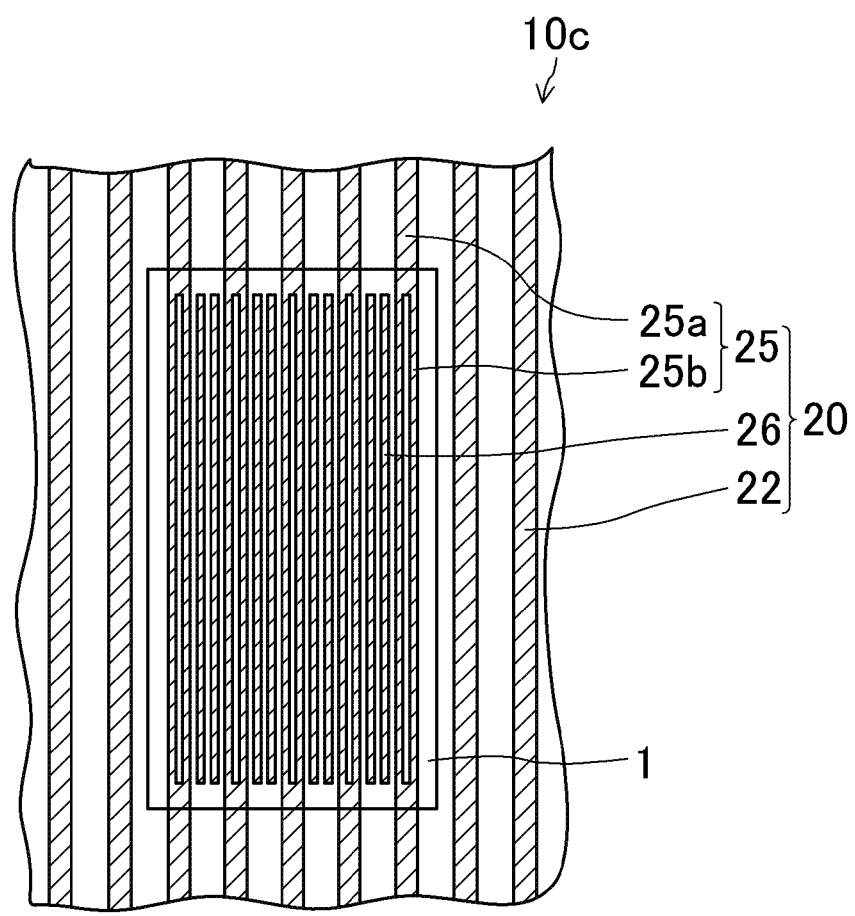
FIG. 4 is a top view schematically illustrating a semiconductor device of a fourth example of the embodiment of the present disclosure.

FIG. 4 is a plan view illustrating a semiconductor device 10c (fourth example) of the present embodiment. The semiconductor device 10c is similar to the semiconductor device 10 illustrated in FIGS. 1(a) and 1(b) in that the semiconductor device 10c includes a semiconductor substrate 4, an insulating film 3, interconnects 20, a pad 1, and elements 5; and that a narrow spacing region where a spacing between the interconnects 20 is shorter is formed. The semiconductor device 10c is particularly different from the semiconductor device 10 in a configuration of the interconnects 20, i.e., the interconnects extending through the narrow spacing region below the pad 1.

In the semiconductor device 10c, interconnects 22 are formed in a section other than the section below the pad 1. Interconnects 25 include an interconnect section 25a and branched interconnect sections 25b. The interconnects 25 are provided, in which the interconnect section 24a is branched into a plurality of branched interconnect sections 25b having a shorter width inside the narrow spacing region below the pad 1, and the branched interconnect sections 25b are combined into the interconnect section 25a having the same width as that of the interconnect 22 in other section. Such a structure is similar to that of the interconnects 24 in the semiconductor device 10b. However, a spacing between the interconnects 25 is the same as the spacing between the interconnects 22.

In the narrow spacing region, dummy interconnects 26 which are not used for an electric connection are formed between the interconnects 25. The width of the dummy interconnect 26 is the same as that of the branched interconnect section 25b. In addition, the dummy interconnects 26 and the branched interconnect sections 25b are formed so as to be adjacent to each other at equal spacing.

According to the foregoing structure, the width of the interconnect 20, and the spacing between the interconnects 20 inside the narrow spacing region below the pad 1 are shorter than those in other section. This reduces occurrence of cracks in the insulating film 3 below the pad 1, current leakage, and element property variation. Consequently, reduction in size of the semiconductor device can be realized.

The branched interconnect sections 25b are not necessarily formed. A structure may be employed, in which interconnects similar to the interconnect 22 are formed so as to extend below the pad 1, and the dummy interconnects 26 are formed between such interconnects. In such a case, a spacing between the interconnects can be shortened. It is desired that the branched interconnect sections 25b and the dummy interconnects 26 have the same width, and be adjacent to each other at equal spacing. However, such a structure is not necessarily employed.

Figure 5A:
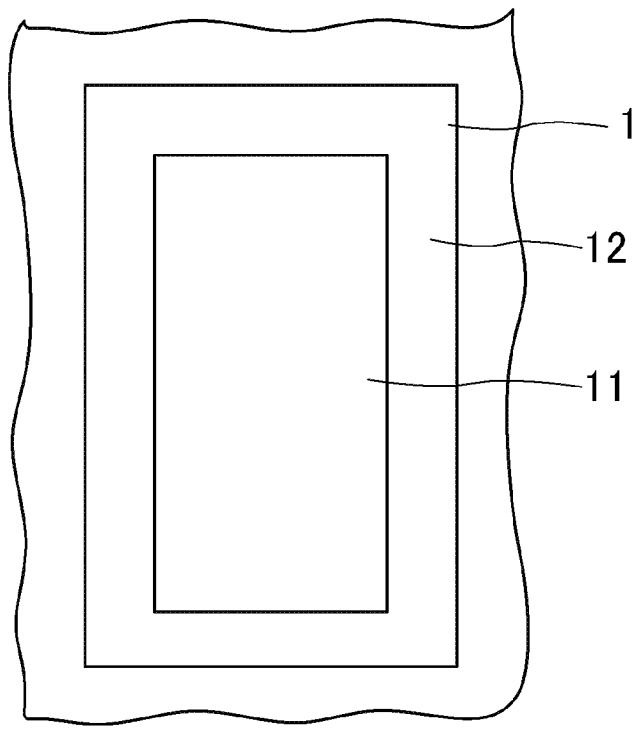
FIGS. 5(a) and 5(b) are top and perspective views schematically illustrating a semiconductor device of a fifth example of the embodiment of the present disclosure.
Figure 5B:
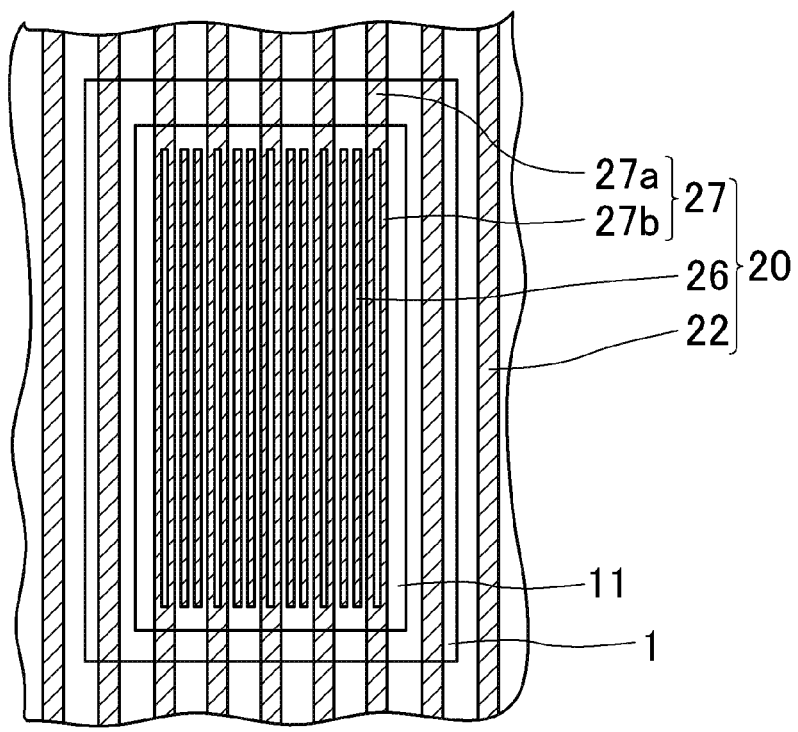

FIGS. 5(a) and 5(b) are views illustrating a semiconductor device 10d (fifth example) of the present embodiment. The semiconductor device 10d is similar to the semiconductor device 10 illustrated in FIGS. 1(a) and 1(b) in that the semiconductor device 10d includes a semiconductor substrate 4, an insulating film 3, interconnects 20, a pad 1, and elements 5, and that a narrow spacing region where a spacing between the interconnects 20 is shorter is formed.

As illustrated in FIG. 5(a) which is a plan view, in the semiconductor device 10d, a test region 11 is formed on the pad. The test region 11 is a region contacting a probe upon an electrical test of the semiconductor device 10d, and is positioned in, e.g., a center section of the pad. However, the test region 11 may be positioned in other section as long as it is on the pad 1.

FIG. 5(b) illustrates a configuration of the interconnects 20 when viewed through the pad 1, the test region 11, etc. The configuration of the interconnects 20 in the semiconductor device 10d is similar to that in the semiconductor device 10c illustrated in FIG. 4. That is, interconnects 27 include an interconnect section 27a and branched interconnect sections 27b. The interconnects 27 are provided, in which the interconnect section 27a is branched into a plurality of branched interconnect sections 27b having a shorter width inside the narrow spacing region below the pad 1, and the branched interconnect sections 27b are combined into the interconnect section 27a having the same width as that of the interconnect 22 in other section. In addition, dummy interconnects 26 are provided between the interconnects 27.

The branched interconnect sections 27b and the dummy interconnects 26 are arranged only within the test region 11 of the pad 1. In other words, the narrow spacing region having the interconnect structure for reducing cracks to be caused in the insulating film 3 extends across a substantially entire section below the pad 1 in the semiconductor device 10c, whereas the narrow spacing region extends across only a section below the test region 11 in the semiconductor device 10d.

As described above, the semiconductor device 10d has a structure in which the region contacting the probe upon the electrical test is defined on the pad 1 in advance; and in which the width of the interconnect 20, and the spacing between the interconnects 20 are shorter in the section below such a region.

According to such a structure, the width of the interconnect 20, and the spacing between the interconnects 20 inside the narrow spacing region below the test region 11 are shorter than those in other section. This reduces occurrence of cracks in the insulating film 3 below the pad 1, current leakage, and element property variation. Consequently, reduction in size of the semiconductor device can be realized.

Further, a section other than the section below the test region 11 can be freely designed without a limitation of the width of the interconnect 20, and a limitation of the spacing between the interconnects 20. In the case illustrated in FIG. 5(b), in a section which is below the pad 1, and which is not overlapped with the test region 11, the interconnects 22 are provided so that the width of the interconnect 22, and the spacing between the interconnects 22 are similar to those in a section other than the section below the pad 1.

As described above, the narrow spacing region where the spacing between the interconnects 20 is shorter is not necessarily formed across the entire section below the pad 1.

In each of the semiconductor devices described above, the single rectangular pad 1 is illustrated in the figures. However, the shape of the pad 1 may be, but not limited to, square, circular, etc. In addition, a plurality of pads 1 may be provided. A position in which the pad 1 is provided in the semiconductor device (e.g., a center section and sections therearound) is not specified.

Bumps, wires, etc. may be connected to the pad 1 as external connecting electrodes. A cantilever type probe, a needle type probe, etc. may be used as the probe used for the electric test.

Figure 6:
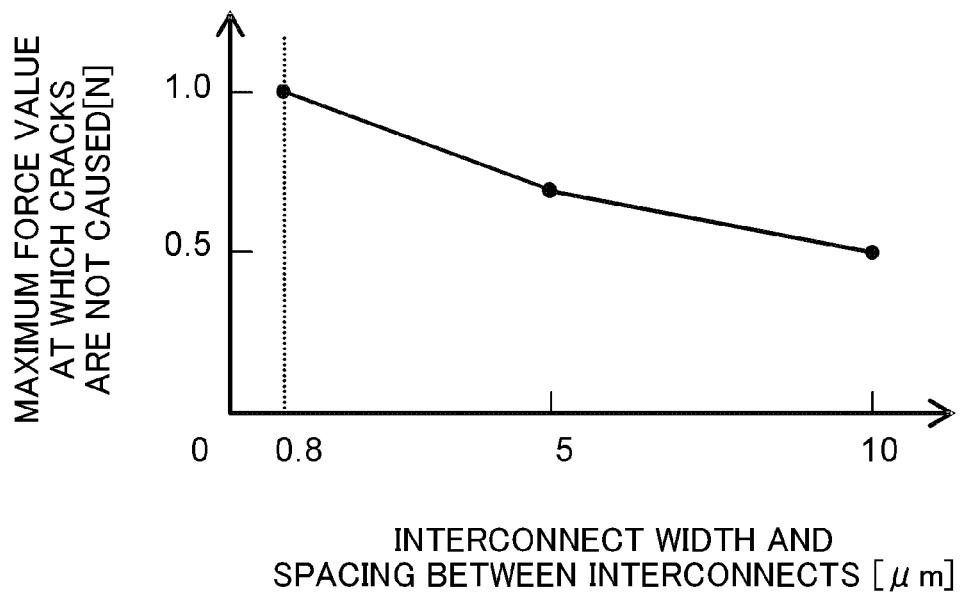
FIG. 6 is a plot illustrating a relationship between an interconnect width and a spacing between adjacent interconnects; and a maximum force value at which cracks are not caused.
Figure 7:
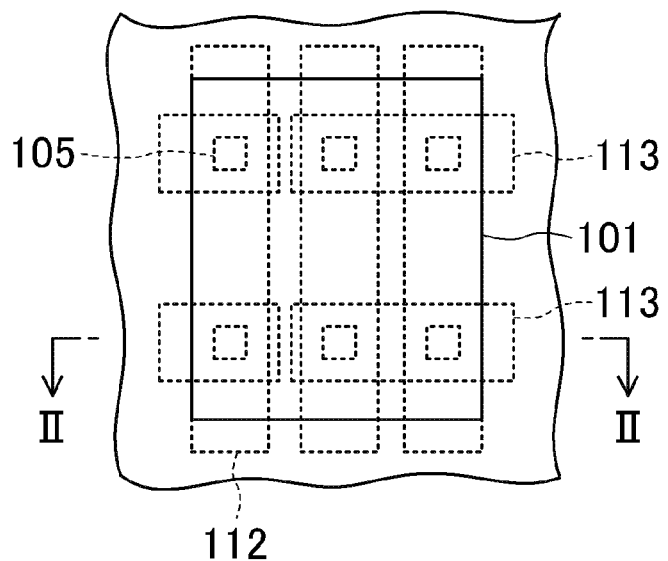
FIG. 7 is a view illustrating a structure of a semiconductor device of a background art.

FIG. 6 illustrates a result of a test in which force is applied to the pad 1 in the vertical direction to compress the pad 1. That is, in FIG. 6, maximum force values at which cracks are not caused in the insulating film 3 are plotted against various sizes of the interconnect 20, assuming that the width of the interconnect 20 below the pad 1, and the spacing between the adjacent interconnects are the same size. When applying force exceeding the plotted value to the pad 1, cracks begin to form.

As will be seen from FIG. 6, a shorter width of the interconnect, and a shorter spacing between the adjacent interconnects result in greater force causing cracks, i.e., result in a stronger structure.

Although not shown in the figure, when conducting a simulation of stress applied to the insulating film in a structure with the different width of the interconnect, and the different spacing between the adjacent interconnects, the following results are obtained.

If a tip end diameter of a probe is smaller than the interconnect width, stress is concentrated on a section in an upper part of the insulating film, and below a section closer to an outer circumferential side of a region where the tip end of the probe contact the pad. On the other hand, if the tip end diameter of the probe is larger than the interconnect width, stress is concentrated on sections below the probe, and corresponding to upper surfaces of the interconnects.

In such a manner, the spacing between the adjacent interconnects, and the interconnect width are shortened, and many interconnects are formed below the pad. Thus, stress is less likely to be transmitted to the insulating film, thereby reducing the occurrence of cracks.

As described above, in the semiconductor device of the present disclosure, the current leakage and the element property variation are reduced, which are caused due to cracks in the insulating film between the pad and the interconnect right below the pad. Thus, by arranging elements, wires, etc. below the pad, the reduction in size of the semiconductor device can be realized with higher reliability.

What is claimed is:

1. A semiconductor device, comprising:
   an insulating film formed on a substrate;
   an interconnect layer including a plurality of interconnects formed in the insulating film; and
   a pad formed on the insulating film,
   wherein, in a region containing at least a part of a section below the pad, a narrow spacing region is formed, where a spacing between the adjacent interconnects is shorter than that in a section outside the region containing at least a part of the section below the pad.

2. The semiconductor device of claim 1, wherein the width of each of the plurality of interconnects inside the narrow spacing region is shorter than that outside the narrow spacing region.

3. The semiconductor device of claim 1, wherein the plurality of interconnects include an interconnect which has a single section outside the narrow spacing region, and which is branched into more than two sections inside the narrow spacing region.

4. The semiconductor device of claim 1, wherein the plurality of interconnects include a non-electrically-connected dummy interconnect arranged inside the narrow spacing region.

5. The semiconductor device of claim 1, wherein at least a single test region is further provided on the pad and above the narrow spacing region.

6. The semiconductor device of claim 1, wherein at least a single bump is formed on the pad and above the narrow spacing region.

7. The semiconductor device of claim 1, wherein at least a single wire is connected to a section on the pad and above the narrow spacing region.

8. The semiconductor device of claim 1, wherein at least a spacing between two interconnects is shortened so as to define a tapered shape from an outside of the narrow spacing region toward an inside of the narrow spacing region.

9. The semiconductor device of claim 1, wherein the plurality of interconnects are formed in the same layer.

* * * * *